United States Patent [19]
Weaver et al.

[11] Patent Number: 5,665,997
[45] Date of Patent: Sep. 9, 1997

[54] GRATED LANDING AREA TO ELIMINATE STICKING OF MICRO-MECHANICAL DEVICES

[75] Inventors: Douglas J. Weaver, Dallas; John N. Randall, Richardson, both of Tex.

[73] Assignee: Texas Instruments Incorporated, Dallas, Tex.

[21] Appl. No.: 221,735

[22] Filed: Mar. 31, 1994

[51] Int. Cl.$^6$ .................................................. H01L 27/14
[52] U.S. Cl. .......................... 257/414; 257/629; 257/773
[58] Field of Search ................................ 257/414, 618, 257/629, 649, 773

[56] References Cited

U.S. PATENT DOCUMENTS

| | | | |
|---|---|---|---|
| 4,209,349 | 6/1980 | Ho et al. | 148/187 |
| 4,256,514 | 3/1981 | Pogge | 148/1.5 |
| 4,358,340 | 11/1982 | Fu | 156/643 |
| 4,502,914 | 3/1985 | Trumpp et al. | 156/643 |
| 4,707,218 | 11/1987 | Giammarco et al. | 156/643 |
| 4,803,181 | 2/1989 | Buchmann et al. | 437/228 |

*Primary Examiner*—Mark V. Prenty
*Attorney, Agent, or Firm*—Julie L. Reed; James C. Kesterson; Richard L. Donaldson

[57] ABSTRACT

A digital micro-mirror device (10), whose contacting elements (11, 17) are not prone to stick together. In the case of a deflecting mirror device, landing electrodes (17) are covered with a grating (19), which reduces the contacting area but still permits conduction between the mirror (11) and the landing electrode (17). Alternatively, the landing electrode (17) can be fabricated as a grated surface.

10 Claims, 2 Drawing Sheets

GRATED LANDING AREA TO ELIMINATE STICKING OF MICRO-MECHANICAL DEVICES

BACKGROUND OF THE INVENTION

A recent development in the field of electro-mechanics has been the miniaturization of various mechanical devices. These "micro-mechanical" devices are manufactured using integrated circuit techniques. Typical of such devices are tiny motors, used in applications such as medicine.

Reliability has been difficult to achieve with micro-mechanical devices. A common reliability problem is sticking, which occurs when the device has a moving part that contacts another surface of the device. The moving element may become stuck against that surface, causing the device to cease to operate properly.

The cause of the sticking is often attributed to an attractive inter-molecular force commonly referred to as the Van der Waals force. This force is related to surface energy, and increases as the surface energy increases. Existing approaches to avoiding sticking have been directed to avoiding or overcoming this force by careful selection of the materials used for the contacting surfaces.

SUMMARY OF THE INVENTION

One aspect of the invention is a micro-mechanical device that avoids sticking of contacting elements. Each of one or more deflecting beam elements has a deflectable beam, an address electrode, and a landing electrode. The spacing of each beam from an associated landing electrode permits the beam to contact the landing electrode in response to a voltage applied to the address electrode. The landing electrode is covered with a grating at least where the beam contacts the landing electrode. Alternatively, the landing electrode itself can be a grating.

A technical advantage of the invention is that, in the case of a DMD type of micro-mechanical device, the height of the grating can be adjusted for a desired tilt angle or to enhance conductivity. The spacing of the grating can also be adjusted for maximum reliability.

The method aspects of the invention are directed to making a grating for contacting elements of a micro-mechanical device. The method is easily integrated into the existing process flow of micro-mechanical device manufacture, using conventional volume wafer fabrication equipment. Yet, the grating lines and spaces are narrower than those made with conventional photolithography techniques.

DETAILED DESCRIPTION OF THE INVENTION

The following description is in terms of a particular type of micro-mechanical device, a digital micro-mirror device (DMD), used for image display applications. In this type of device, tiny mirrors tilt to reflect light to an image plane. An array of these mirrors is used to form an image. In the case of a DMD, the method of the invention prevents sticking of the mirrors to a "landing pad" which they touch when tilted. The images formed by the DMD can be used in display systems or for non-impact printing applications. Other applications of DMD's are possible that do not involve image formation, such as optical steering and switching and accelerometers. In some of these applications, the "mirror" need not be reflective, and is sometimes referred to as a moveable "beam". Also, in some applications, the DMD is not necessarily be operated in a digital mode. In general, the term "DMD" is used herein to include any type of micro-mechanical device having deflecting beam elements that contact a landing electrode in response to a voltage applied to an address electrode.

Figure 1:
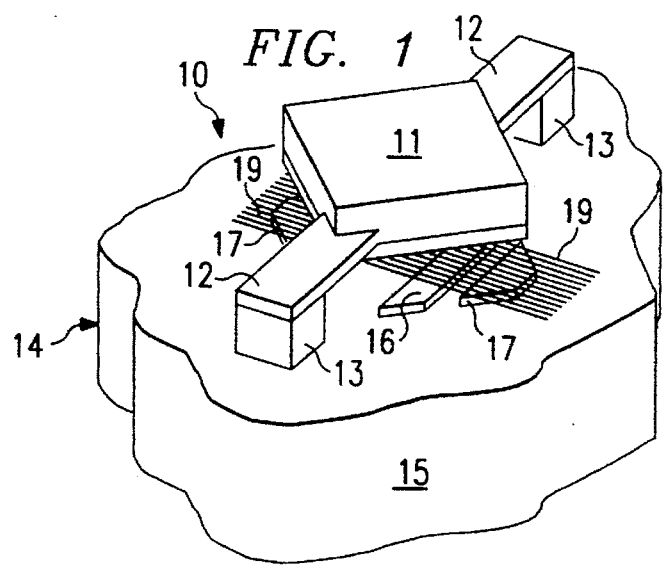
FIG. 1 illustrates an undeflected mirror element of one type of micro-mechanical device, a digital micro-mirror device (DMD), having contacting surfaces made from incompatible materials in accordance with the invention.
Figure 2:
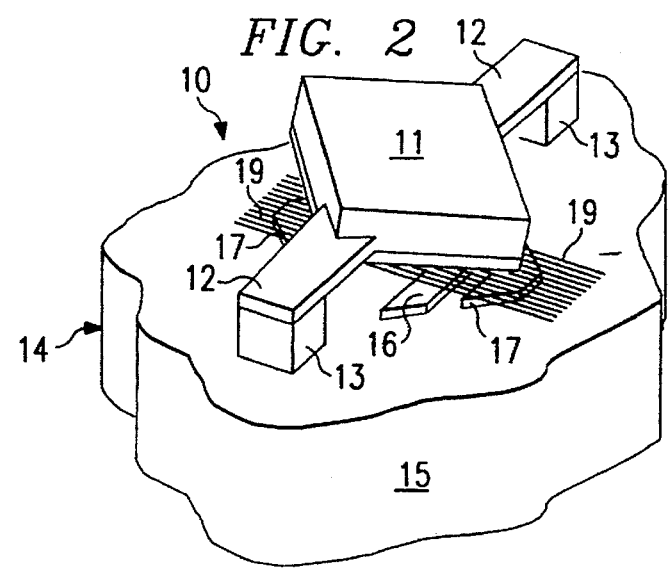
FIG. 2 illustrates the mirror element of FIG. 1 in a deflected position.

FIGS. 1 and 2 illustrate a single mirror element 10 of a DMD. In FIG. 1, the mirror element 10 is in a flat (undeflected) state, whereas in FIG. 2, the mirror element 10 is deflected. A typical DMD has an array of hundreds of such mirror elements 10.

The mirror element 10 of FIGS. 1 and 2 is known as a "torsion beam" mirror element. Other types of beam elements 10 can be fabricated, including cantilever types and "hidden hinge" types, the latter being a variation of the torsion beam type illustrated in FIGS. 1 and 2. Various DMD types and others are described in U.S. Pat. No. 4,662,746, entitled "Spatial Light Modulator and Method", U.S. Pat. No. 4,956,610, entitled "Spatial Light Modulator", U.S. Pat. No. 5,061,049 entitled "Spatial Light Modulator and Method", and U.S. Pat. No. 5,083,857 entitled "Multi-level Deformable Mirror Device". Each of these patents is assigned to Texas Instruments Incorporated and each is incorporated herein by reference.

In operation for display applications, a light source illuminates the surface of the DMD with visible white light. A condenser lens (not shown) may be used to shape the light to approximately the size of the array of mirror elements 10 and to direct this beam to their reflective surfaces. Each mirror element 10 has a tilting mirror 11 supported by torsion hinges 12 attached to support posts 13. The mirrors 11 are positioned over an address/memory circuit 14, which is fabricated on a silicon substrate 15. Electrostatic forces based on the data in the memory cells of address/memory circuit 14 tilt each mirror 11 either +10 degrees (on) or −10 degrees (off), thereby modulating the light incident on the surface of the DMD. Light reflected from the on mirrors 11 is directed to a viewer, via various display optics (not shown), to create images. Light from the off mirrors is reflected away from the viewer. The proportion of time during each image frame that a mirror 11 remains in the on position determines shades of grey. Color can be added by means of a color wheel or by a three-DMD setup (not shown).

Address/memory circuit 14 has a memory cell associated with each mirror element 10, as well as two address electrodes 16 and two landing electrodes 17. The mirror 11 has three states. It operates in a bistable mode, tilting 10 degrees about the hinges 12 in one or the other direction. The third state is a flat position to which the mirrors 11 return when the display is not in operation.

In effect, the mirror 11 and the address electrodes 16 form capacitors. When +5 volts (digital 1) is applied to one address electrode 16, 0 volts (digital 0) is applied to the other address electrode 16, and a negative bias to the mirror 11, the electrostatic charge thus created causes mirror 11 to tilt toward the +5 volt electrode 16. The voltage on the address electrode 16 starts the mirror 11 tilting, whereupon it continues under its own momentum until it hits the landing electrode 17.

Once a mirror 11 tilts in either direction, it remains electro-mechanically latched in that state. Merely changing the states of the address electrodes 16 will not cause the mirror to move; it is removal of the bias on each mirror 11 that causes it to return to its untilted position. When the bias is reapplied, the mirrors 11 tilt in accordance with their new address states.

FIGS. 1 and 2 illustrate one aspect of the invention, a grating 19 over each landing electrode 17 of each mirror 11. As explained below, grating 19 may cover only the contacting area, but may also be designed so that the grating 19 can overlap onto other surfaces of the address/memory circuit 14, without adversely affecting the operation of the DMD. The grating 19 reduces the contact area between the underside of mirror 11 and landing electrode 17. The result is that mirror 11 is less likely to become stuck in either an on or off position.

For many applications of DMDs, landing electrodes 17 are electrically conductive. For example, in the image display application described above, a voltage is applied to each landing electrode 17 with the same voltage applied to the mirror element 11, until the reset voltage is applied to the mirror element 11. A feature of the invention is a grating 19 that will not substantially inhibit this conductivity. FIGS. 3-6 illustrate one method of making such a grating. However, other processes could be used, such as holographic or E-beam patterning and etching.

The process of FIGS. 3-6 may be performed on a wafer from which multiple DMD arrays are being fabricated. The process of FIGS. 3-6 is especially suited for volume production of this type, and is easily integrated into the process flow for making DMDs or other micro-mechanical devices. Again, for purposes of example, the following description is in terms of a DMD.

Figure 3:
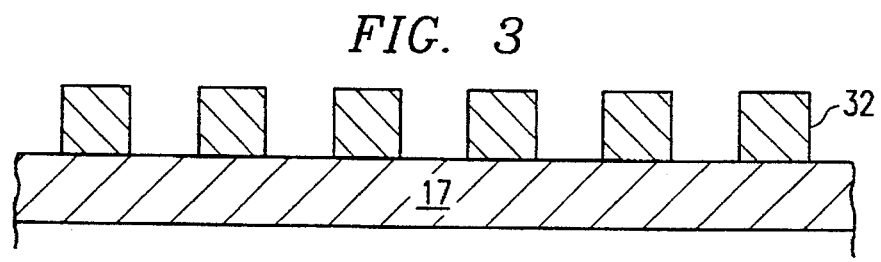
FIGS. 3–6 illustrate a process of fabricating a grated landing area in accordance with the invention.

In FIG. 3, the mirror elements 10 of a DMD array have been partially fabricated. Specifically, address/memory layer 14 includes the landing electrodes 17. Although not explicitly illustrated, it is assumed that landing electrodes 17 have already been etched from a conductive material such as aluminum. A photoresist pattern 32 is patterned over layer 14 and comprises a pattern of lines and spaces. Photoresist pattern 32 can be fabricated using known photoresist deposition, exposure, and etching techniques. A typical pattern achievable with these techniques has lines and spaces of approximately 1 micrometer each. If desired, the spacing between the photoresist lines could be increased. This spacing is related to the conductivity between landing electrode 17 and the underside of mirror 11, in that wider spaces will enhance conductivity.

The photoresist pattern 32 is placed over at least each contact area of each landing electrode 17. However, the photoresist pattern 32 may cover the entire area of landing electrodes 17. Also, it may overlap, entirely or completely, other areas underneath mirrors 11, such as the address electrodes 16. Regardless, the pattern is arranged over address/memory layer 14 in a pattern that permits subsequent formation of support posts 13.

As will become clear, the height of the lines of photoresist pattern 32 determines the height of the lines of grating 19. The height of pattern 32 can be varied for various reasons, such as for increased conductivity or to control the tilt angle of mirrors 11. A typical height might be approximately 500 angstroms.

Figure 4:
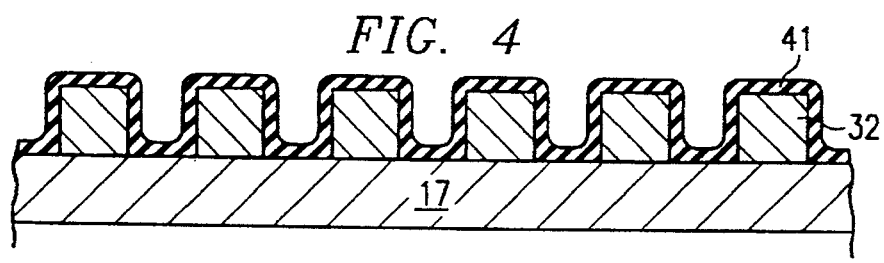

As shown in FIG. 4, a silicon nitride layer 42 is deposited over the photoresist pattern 32. Various known sidewall deposition techniques known in the field of integrated circuit fabrication can be used. Preferably the deposition is a low temperature deposition so as to avoid disruption of the electrode layer 31. The deposition material, silicon nitride, is desirable because of its hardness and resistance to sticking. Also, it can be deposited conformally, in that is results in a deposited layer that is substantially uniform along vertical and horizontal surfaces of the underlying layer. Alternative materials meeting these criteria could be used, such as silicon oxynitride and silicon dioxide.

Figure 5:
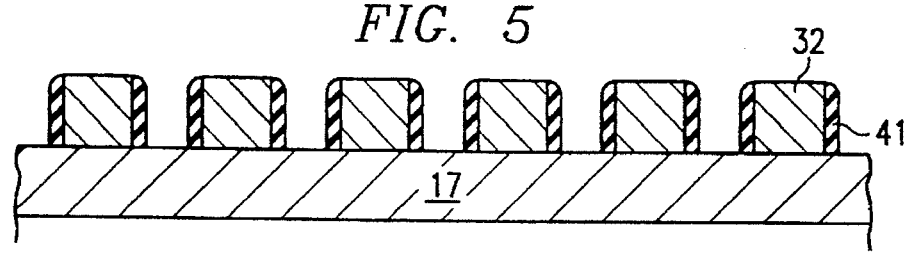

As shown in FIG. 5, the silicon nitride layer 42 is then etched so as to remove the silicon nitride from the tops of the lines of photoresist pattern 32, thereby leaving sidewalls along each line. This etching can be performed with reactive ion etching techniques.

Figure 6:
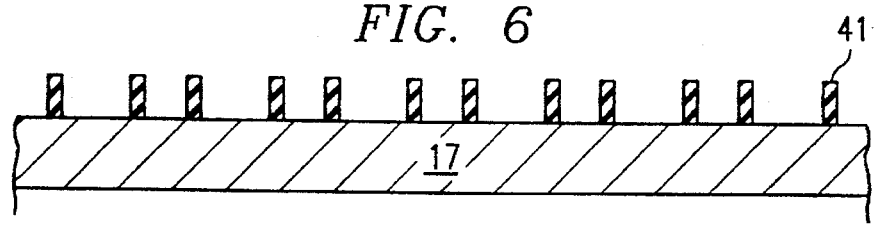

In FIG. 6, the photoresist pattern 31 has been removed, leaving the silicon nitride sidewall lines. This step can be performed using oxygen plasma etch techniques.

As a result of the above-described process, the silicon nitride sidewall become a grating 19, which has a line width of approximately 0.2–0.3 micrometers. The distance between the lines is approximately 1 micrometer, where the photoresist lines have been removed, or approximately 0.6 micrometer, where the spacing between the photoresist lines was.

Figure 7:
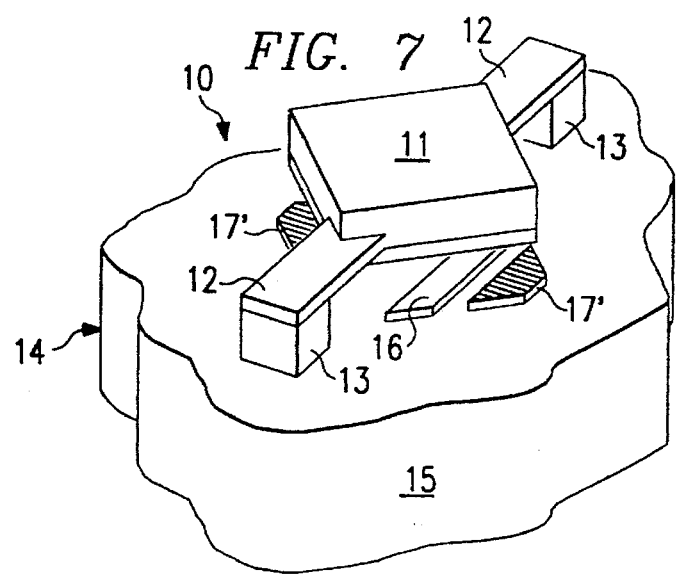
FIG. 7 illustrates the mirror element of FIG. 1, except that the landing electrode is grated rather than having a grating above it.

FIG. 7 illustrates a variation of the mirror element 10 of FIGS. 1 and 2, in which the landing electrodes 17' are grated rather than having a grating 19 fabricated over them. Various techniques can be used to etch into landing electrode 17 after they are patterned with a flat surface, or alternatively, to pattern landing electrodes 17 as lines and spaces.

Figure 8:
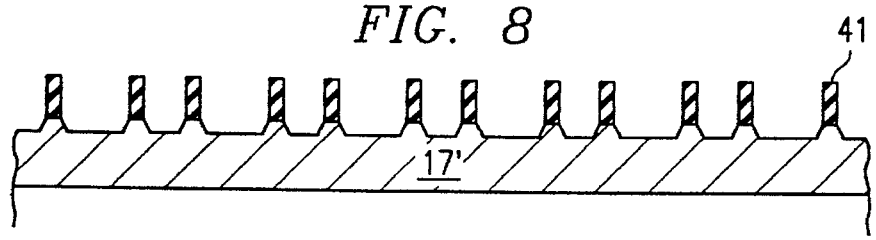
FIGS. 8 and 9 illustrate additional steps to be added to the process of FIGS. 3–6 for providing the grated electrode of FIG. 7.
Figure 9:
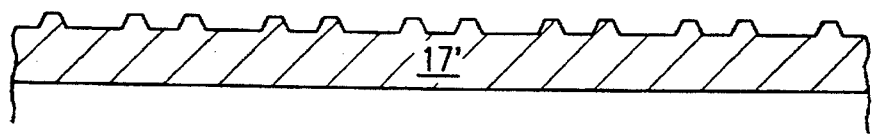

FIGS. 8 and 9 illustrate two additional steps that can be added to the process after the step of FIG. 6 to provide these grated electrodes 17'. As in FIGS. 3–6, this process is performed on a wafer from which multiple arrays of DMDs are being fabricated. Address/memory layer 14 has flat landing electrode surfaces made from a conductive material such as aluminum.

In FIG. 8, an etch is performed into the landing electrodes 17, which are at the surface of address/memory layer 14. The silicon nitride lines serve as an etch mask. The depth of the etch can be controlled for a desired grating height. A suitable etching process is a reactive ion etch. In FIG. 9, the silicon nitride lines are removed, leaving grated landing electrodes 17'.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A micro-mechanical device, comprising:
   one or more deflecting beam elements, each beam element having a deflectable beam, an address electrode, and a landing electrode;

wherein the spacing of each said beam from an associated landing electrode permits said beam to contact said landing electrode in response to a voltage applied to said address electrode; and wherein each said landing electrode is covered with a grating at least where said beam contacts said landing electrode.

2. The micro-mechanical device of claim 1, wherein said beam and said landing electrode are made from an electrically conductive material and wherein said grating has sufficiently thin lines or spaces so as to not substantially inhibit electrical conduction between said beam and said landing electrode.

3. The micro-mechanical device of claim 1, wherein said grating is fabricated from silicon nitride.

4. The micro-mechanical device of claim 1, wherein said grating covers at least part of said address electrode as well as at least part of said landing electrode.

5. The micro-mechanical device of claim 1, wherein each said beam element has two address electrodes and two landing electrodes and wherein said grating covers the contact area of said two landing electrodes.

6. The micro-mechanical device of claim 1, wherein said grating has lines having a width of approximately 0.2 to 0.3 micrometers.

7. A micro-mechanical device, comprising:

one or more deflecting beam elements, each beam element having a deflectable beam, an address electrode, and a landing electrode;

wherein the spacing of each said beam from an associated landing electrode permits said beam to contact said landing electrode in response to a voltage applied to said address electrode; and wherein each said landing electrode has a grated surface at least where said beam contacts said landing electrode.

8. The micro-mechanical device of claim 7, wherein said beam and said landing electrode are made from an electrically conductive material.

9. The micro-mechanical device of claim 7, wherein each said beam element has two address electrodes and two landing electrodes and wherein said grated surface is at the contact area of said two landing electrodes.

10. The micromechanical device of claim 7, wherein said grated surface has lines having a width of approximately 0.2 to 0.3 micrometers.

* * * * *